(12) United States Patent
Harkins

(10) Patent No.: US 9,955,613 B2
(45) Date of Patent: Apr. 24, 2018

(54) COOLER AND POWER ELECTRONIC MODULE HAVING THE SAME

(71) Applicants: DENSO International America, Inc., Southfield, MI (US); DENSO CORPORATION, Kariya, Aichi-pref. (JP)

(72) Inventor: James K. Harkins, Canton, MI (US)

(73) Assignees: DENSO International America, Inc., Southfield, MI (US); DENSO CORPORATION, Kariya (JP)

( * ) Notice: Subject to any disclaimer, the term of this patent is extended or adjusted under 35 U.S.C. 154(b) by 0 days.

(21) Appl. No.: 15/263,843

(22) Filed: Sep. 13, 2016

(65) Prior Publication Data

US 2018/0077818 A1 Mar. 15, 2018

(51) Int. Cl.
*H05K 7/20* (2006.01)
*H01L 23/473* (2006.01)

(52) U.S. Cl.
CPC .......... *H05K 7/2089* (2013.01); *H05K 7/209* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| 5,495,889 | A | 3/1996 | Dubelloy |
| 7,417,857 | B2 | 8/2008 | Rondier et al. |
| 8,714,302 | B2 | 5/2014 | Gradinger et al. |
| 2005/0030717 | A1* | 2/2005 | Inagaki ............... H01L 23/4334 361/699 |

(Continued)

FOREIGN PATENT DOCUMENTS

| JP | 2009-266936 A | 11/2009 |
| JP | 2010-040757 A | 2/2010 |

(Continued)

*Primary Examiner* — Anthony Haughton
*Assistant Examiner* — Razmeen Gafur

(57) ABSTRACT

The present disclosure provides a power electronic module that includes a first power device having a first switching element and a second power device having a second switching element. The power electronic module further includes a cooler having a coolant passage to cool the first and second power devices. The cooler includes a first inner fin and a second inner fin in the coolant passage. The first power device and the second power device are disposed along a flow direction of the coolant passage so that the first power device is arranged on an upstream side of the coolant passage from the second power device. The first inner fin and the second inner fin are disposed along the flow direction corresponding to the first and second power devices so that the first inner fin is arranged on the upstream side from the second inner fin. The first inner fin has a corrugated passage and a straight passage. The straight passage bypasses the corrugated passage along the flow direction of the coolant passage.

14 Claims, 5 Drawing Sheets

(56) References Cited

U.S. PATENT DOCUMENTS

| | | | |
|---|---|---|---|
| 2005/0051298 A1* | 3/2005 | Sakai | F28F 3/12 165/80.4 |
| 2005/0259402 A1* | 11/2005 | Yasui | H02M 7/003 361/716 |
| 2006/0243422 A1* | 11/2006 | Sakai | H01L 23/473 165/80.4 |
| 2007/0064396 A1* | 3/2007 | Oman | H01L 23/427 361/700 |
| 2010/0296247 A1* | 11/2010 | Chang | H05K 7/20927 361/699 |
| 2010/0315780 A1* | 12/2010 | Murakami | H01L 23/473 361/699 |
| 2011/0122583 A1* | 5/2011 | Lowry | H01L 23/433 361/699 |
| 2011/0134609 A1* | 6/2011 | Folts | H01L 23/4006 361/717 |
| 2011/0317366 A1* | 12/2011 | Fukutani | H01L 25/072 361/699 |
| 2012/0008282 A1* | 1/2012 | Ide | H01L 23/4334 361/702 |
| 2012/0229985 A1* | 9/2012 | Okumura | H01L 25/18 361/716 |
| 2012/0287577 A1* | 11/2012 | Sevakivi | H01L 23/473 361/702 |
| 2013/0003301 A1* | 1/2013 | Miyamoto | H01L 23/473 361/699 |
| 2013/0107455 A1* | 5/2013 | Cottet | H05K 7/20672 361/694 |
| 2013/0157089 A1* | 6/2013 | Miyatake | H05K 7/20509 429/72 |
| 2013/0258594 A1* | 10/2013 | Gradinger | F28D 15/02 361/700 |
| 2013/0335918 A1* | 12/2013 | Tachibana | H05K 5/0213 361/689 |
| 2014/0098496 A1* | 4/2014 | Nakasaka | H01L 23/473 361/699 |
| 2014/0153189 A1* | 6/2014 | Okamura | H05K 1/0213 361/688 |
| 2014/0285969 A1* | 9/2014 | Kojima | H01G 2/14 361/689 |
| 2014/0321057 A1* | 10/2014 | Cummings | H01L 31/02021 361/699 |
| 2015/0189790 A1* | 7/2015 | Tachibana | H05K 7/20254 361/699 |
| 2015/0250074 A1* | 9/2015 | Matsumoto | H05K 7/20936 361/696 |
| 2015/0348869 A1* | 12/2015 | Joshi | H01L 23/4735 361/700 |

FOREIGN PATENT DOCUMENTS

| | | |
|---|---|---|
| JP | 2010-040870 A | 2/2010 |
| JP | 2011-233688 A | 11/2011 |

* cited by examiner

COOLER AND POWER ELECTRONIC MODULE HAVING THE SAME

FIELD

The present disclosure relates to a cooler for cooling a power device and a power electronic module having the cooler.

BACKGROUND

This section provides background information related to the present disclosure which is not necessarily prior art.

A power electronic module has been used in a vehicle to drive the vehicle with electric power. Generally, a conventional power electronic module may have a plurality of power devices and a cooler having a coolant passage to cool the power devices. Each of the power devices may have a switching element, such as an IGBT, a MOSFET, and so forth. The switching elements may cooperate together to generate the electric power for driving the vehicle. On the other hand, each of the switching elements may generate heat as well. The cooler may cool the switching elements and maintain a low temperature of switching elements so that the coolant passage may exchange heat with the switching elements.

One of the conventional power electronic modules may have a plurality of pairs of the power devices. Each pair of the power devices may be disposed along a flow direction of the coolant passage. In that case, coolant which flows through the coolant passage may exchange heat with one of the two power devices at first. Then, the warmed coolant may exchange heat with the other of the two power devices. Thus, temperature imbalance between the two power devices, which exchange heat with the same coolant passage, may occur. In other words, the power device, which is arranged on a downstream side of the coolant passage, may operate at a higher temperature than the power device, which is arranged on an upstream side of the coolant passage.

As a result, the temperature imbalance may cause resistance imbalance and circuit imbalance between the two power devices when the two power devices are used in parallel. Eventually, the temperature imbalance may influence inefficient operation of the power devices as a whole.

SUMMARY

This section provides a general summary of the disclosure, and is not a comprehensive disclosure of its full scope or all of its features.

An aspect of the present disclosure provides a power electronic module that includes a first power device having a first switching element and a second power device having a second switching element. The power electronic module further includes a cooler having a coolant passage to cool the first and second power devices. The cooler includes a first inner fin and a second inner fin in the coolant passage. The first power device and the second power device are disposed along a flow direction of the coolant passage so that the first power device is arranged on an upstream side of the coolant passage from the second power device. The first inner fin and the second inner fin are disposed along the flow direction corresponding to the first and second power devices so that the first inner fin is arranged on the upstream side from the second inner fin. The first inner fin has a corrugated passage and a straight passage. The straight passage bypasses the corrugated passage along the flow direction of the coolant passage.

According to an aspect of the present disclosure, coolant bypasses the corrugated passage through the straight passage. Such bypassing coolant has a lower temperature than the coolant, which flows through the corrugated passage. The second switching element is cooled by the bypassing coolant in addition to such warmed coolant so that a temperature of the second switching element may be maintained at a similar temperature to the first switching element.

Further areas of applicability will become apparent from the description provided herein. The description and specific examples in this summary are intended for purposes of illustration only and are not intended to limit the scope of the present disclosure.

DRAWINGS

The above and other objects, features and advantages of the present invention will become more apparent from the following detailed description made with reference to the accompanying drawings. The drawings described herein are for illustrative purposes only of selected embodiments and not all possible implementations, and are not intended to limit the scope of the present disclosure.

DETAILED DESCRIPTION

Figure 1:
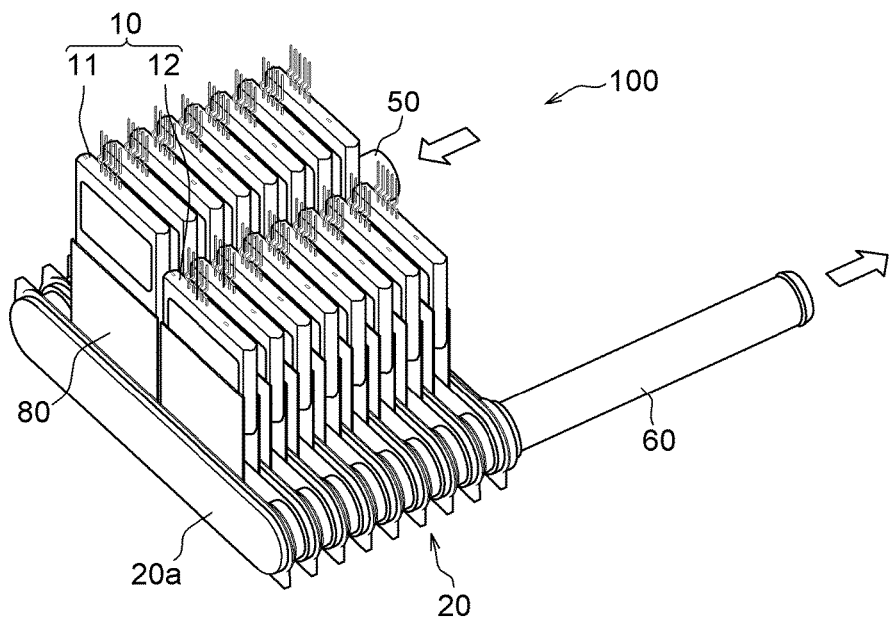
FIG. 1 is a partial perspective view illustrating a power electronic module according to the first embodiment.

A plurality of embodiments of the present disclosure will be described hereinafter referring to drawings. In the embodiments, a part that corresponds to a matter described in a preceding embodiment may be assigned with the same reference numeral, and redundant explanation for the part may be omitted. When only a part of a configuration is described in an embodiment, another preceding embodiment may be applied to the other parts of the configuration. The parts may be combined even if it is not explicitly described that the parts may be combined. The embodiments may be partially combined even if it is not explicitly described that the embodiments may be combined, provided there is no harm in the combination.

First Embodiment

Configuration of a power electronic module 100 according to the first embodiment will be described.

The power electronic module 100 is equipped in a vehicle, such as a hybrid electric vehicle, an electric vehicle, and so forth. The power electronic module 100 provides the vehicle with electric power to drive the vehicle.

FIG. 1 depicts a partial perspective view illustrating the power electronic module 100 according to the present embodiment. FIG. 1 shows the power electronic module 100 that includes a plurality of power devices 10, a cooler 20, and ceramic insulators 80. It should be noted that the power devices 10 and the ceramic insulators 80 are inserted into gaps of the cooler 20.

The plurality of the power devices 10 are composed of eight pairs of a first power device 11 and a second power device 12. In the other words, the power electronic module 100 has eight of the first power devices 11 and eight of the second power devices 12. The first power devices 11 are stacked with the cooler 20. The second power devices 12 are stacked with the cooler 20 along a stacking direction of the first power devices 11 in parallel with the first power devices 11. Current flows through the plurality of the power devices, and the first and second power devices 11, 12 are used in parallel electrically. The power devices 10 generate the electric power as a whole so that the vehicle may be driven by electric power.

The cooler 20 is configured to cool the plurality of the power devices 10. The cooler 20 has a coolant passage, which coolant flows through. The coolant passage exchanges heat with the power devices 10. The cooler 20 includes a plurality of tubes 20a, an inlet pipe 50, and an outlet pipe 60.

In this example, the number of the tubes 20a is nine. Each of the pairs of the first power device 11 and the second power device 12 is disposed between the tubes 20a. Each of the tubes 20a is hollow and has the coolant passage inside. The coolant, which flows through the tubes 20a, exchanges heat with the power devices 10. In other words, the power devices 10 are cooled by the coolant, which flows through the tubes 20a. The plurality of the tubes 20a are connected each other at both ends of the tubes 20a. The plurality of the tubes 20a are stacked with the power devices 10 in the stacking direction so that the coolant passages of the tubes 20a are connected each other.

The inlet pipe 50 is disposed at one end of the tube 20a, which is stacked the most outside in the stacking direction. The inlet pipe 50 is hollow and has the coolant passage inside. The coolant, which flows through the inlet pipe 50, is distributed to each of the tubes 20a.

On the other hand, the outlet pipe 60 is disposed at the other end of the tube 20a, which is the same tube 20a connected with the inlet pipe 50. The outlet pipe 60 is hollow and has the coolant passage inside. The coolant, which flows through the tubes 20a, is collected by the outlet pipe 60. The coolant, which flows through the outlet pipe 60, has a higher temperature than the coolant, which flows through the inlet pipe 50.

The coolant flows through the tubes 20a along a flow direction from the one end, where the inlet pipe 50 is connected, to the other end, where the outlet pipe 60 is connected. The first power device 11 and the second power device 12 are disposed along the flow direction so that the first power device 11 is arranged on the upstream side of the coolant passage from the second power device 12. The first power device 11 is disposed closer to the inlet pipe 50 than the second power device 12. In other words, the second power device 12 is closer to the outlet pipe 60 than the first power device 11.

The ceramic insulators 80 are disposed between each of the power devices 10 and the cooler 20. More specifically, in this example, the number of the ceramic insulators 80 is thirty two. The power devices 10 have thermal connection with the tubes 20a via the ceramic insulators 80 without providing an electric connection.

Figure 2:
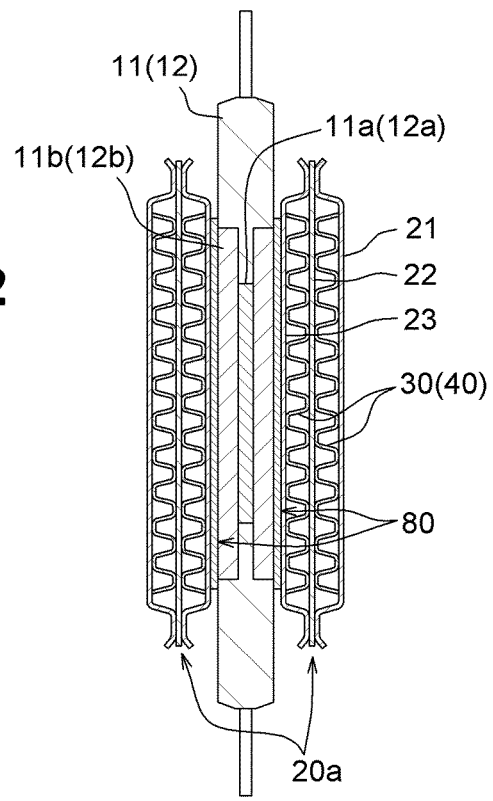
FIG. 2 is a sectional view illustrating a power device and a cooler according to the first embodiment.

FIG. 2 depicts a sectional view illustrating the first power device 11 and the two tubes 20a of the cooler 20 according to the present embodiment. FIG. 2 shows the first power device 11 that includes a first switching element 11a and two of first heat sinks 11b.

The first switching element 11a is for example, an IGBT, a MOSFET, and so forth. The first switching element 11a is configured to switch current, which flows therein. The first switching element 11a generates heat since the current flows in the first switching element 11a.

The first heat sinks 11b are metal plates which are broader than the first switching element 11a. The first heat sinks 11b are electrically connected to the first switching element 11a. Therefore, the current, which flows in the first switching element 11a, goes through the first heat sinks 11b.

The first heat sinks 11b are thermally connected to the first switching element 11a so that the heat, which is generated by the first switching element 11a, is radiated from surfaces of the first heat sinks 11b. The first power device 11 has such radiation surfaces on both sides thereof. More specifically, each of the first heat sinks 11b has the radiation surface on an opposite side to the first switching element 11a.

The first power device 11 further includes a resin, which molds the first switching element 11a and the first heat sinks 11b integrally. The radiation surfaces of the first heat sinks 11b are exposed from the resin.

Each of the tubes 20a includes an upper plate 21, a center plate 22, a lower plate 23, and inner fins 30, 40. The upper plate 21 is laminated or stacked on one side of the center plate 22 to provide a half of the coolant passage of the tube 20a. The lower plate 23 is laminated or stacked on the other side of the center plate to provide the other half of the coolant passage of the tube 20a. In other words, the center plate 22 divides the coolant passage of the tube 20a into two passages.

The inner fins 30, 40 are disposed between the upper plate 21 and the center plate 22. The inner fins 30, 40 are further disposed between the lower plate 23 and the center plate 22 as well. The inner fins 30, 40 are capable to disturb stream of the coolant which flows through the tube 20a. The inner fins 30, 40 are configured to improve cooling the power devices 10.

The ceramic insulators 80 are broader than the exposed radiation surfaces of the first heat sinks 11b. The ceramic insulators 80 are configured to insulate the exposed radiation surfaces of the first heat sinks 11b from the tubes 20a.

It should be noted that the second power device 12 has the same structure as the first power device 11. The second power device 12 includes a second switching element 12a and two of second heat sinks 12b. The second switching element 12a is for example, an IGBT, a MOSFET, and so forth. The second switching element 12a is configured to switch current, which flows in the switching element 12a, in parallel with the first switching element 11a. The second switching element 12a generates heat since the current flows in the second switching element 12a.

The second heat sinks 12b have the same structure as the first heat sinks 11b. The second power device 12 has the same molding structure as the first power device 11. The second power device 12 further has the same insulation structure as the first power device 11.

Figure 3:
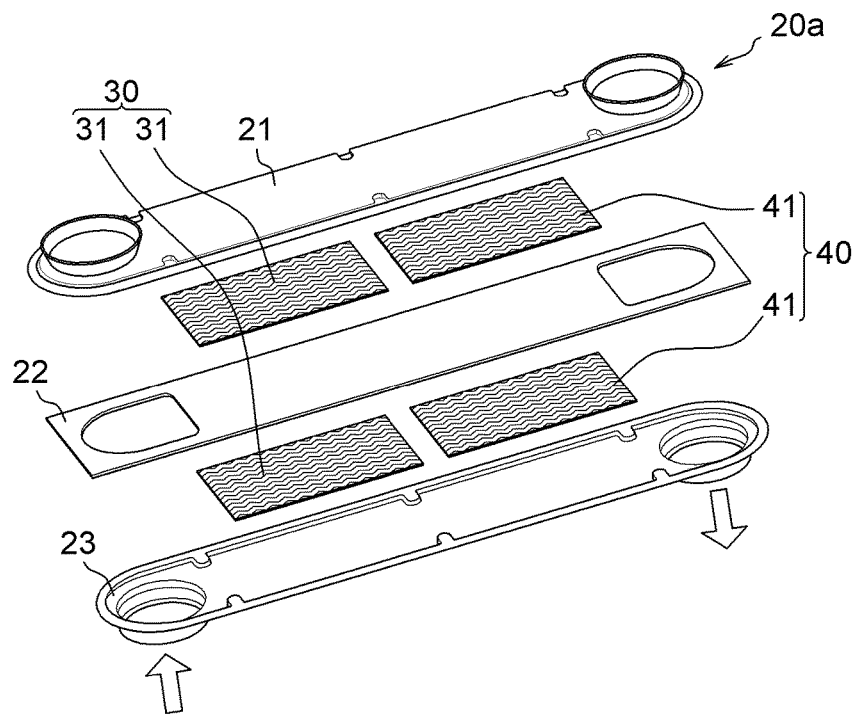
FIG. 3 is an exploded view illustrating a tube of the cooler according to the first embodiment.

FIG. 3 depicts an exploded view illustrating the tube 20a of the cooler 20 according to the current embodiment. FIG. 3 shows the tube 20a that has a first inner fin 30 and a second inner fin 40 in addition to the upper plate 21, the center plate 22, and the lower plate 23.

The first inner fin 30 is composed of two of first fin plates 31. One of the first fin plates 31 are disposed between the upper plate 21 and the center plate 22. The other of the first fin plates 31 are disposed between the lower plate 23 and the center plate 22.

The first fin plates 31 are made of aluminum. The first fin plates 31 are laminated or stacked with the upper plate 21, the center plate 22, and the lower plate 23. The first fin plates 31 are accommodated in the coolant passage of the tube 20a.

The second inner fin 40 is composed of two of second fin plates 41. One of the second fin plates 41 are disposed between the upper plate 21 and the center plate 22 together with the first fin plate 31. The other of the second fin plates 41 are disposed between the lower plate 23 and the center plate 22 together with the first fin plate 31.

The second fin plates 41 are made of copper, which has a higher thermal conductivity than aluminum. The second fin plates 41 are laminated or stacked with the upper plate 21, the center plate 22, and the lower plate 23 in parallel with the first fin plates 31. The second fin plates 41 are accommodated in the coolant passage of the tube 20a.

The upper plate 21 has openings at both ends thereof. The center plate 22 has openings at both ends thereof. The lower plate 23 has openings at both ends thereof as well. The openings at one end of the upper plate 21, the center plate 22, and the lower plate 23 provide the coolant passage, which is connected to the inlet pipe 50. The openings at the other end of the upper plate 21, the center plate 22, and the lower plate 23 provide the coolant passage, which is connected to the outlet pipe 60.

Figure 4:
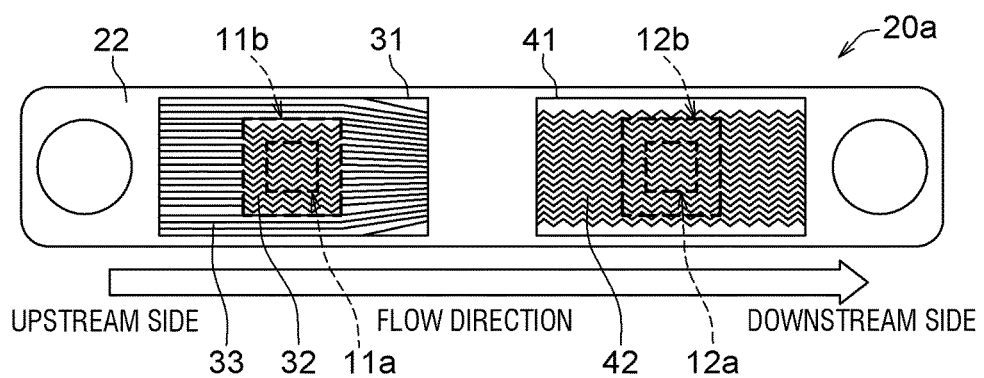
FIG. 4 is a plane view schematically illustrating the tube according to the first embodiment.

FIG. 4 depicts a plane view schematically illustrating the tube 20a according to the present embodiment. FIG. 4 shows the center plate 22 and the first and second fin plates 31, 41. Two bigger imaginary squares, which are drawn by dotted lines in FIG. 4, show two shades of the first heat sink 11b and the second heat sinks 12b. Two smaller imaginary squares, which are drawn by dotted lines in FIG. 4, show two shades of the first switching element 11a and the second switching element 12a.

The first fin plate 31 and the second fin plate 41 are disposed along the flow direction of the coolant passage so that the first fin plate 31 is arranged on the upstream side of the coolant passage from the second fin plate 41. The first fin plate 31 is disposed closer to the inlet pipe 50 than the second fin plate 41. In other words, the second fin plate 41 is closer to the outlet pipe 60 than the first fin plate 31. The first fin plate 31 is located on the one end side of the tube 20a. The second fin plate 41 is located on the other end side of the tube 20a.

The first fin plate 31 and the second fin plate 41 are disposed apart from each other. In other words, the first fin plate 31 and the second fin plate 41 leave a space between themselves. The first and second fin plates 31, 41 have a similar width to the coolant passage of the tube 20a.

Figure 5:
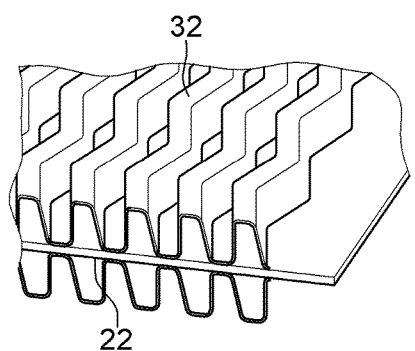
FIG. 5 is a partial perspective view illustrating a corrugated portion of a first inner fin according to the first embodiment.

The first fin plate 31 has a corrugated portion 32 and a straight portion 33. FIG. 5 is a partial perspective view illustrating the corrugated portion 32 according to the present embodiment. The corrugated portion 32 has a waving shape in a width direction of the coolant passage and provides a plurality of corrugated passages which extends in the flow direction.

Figure 6:
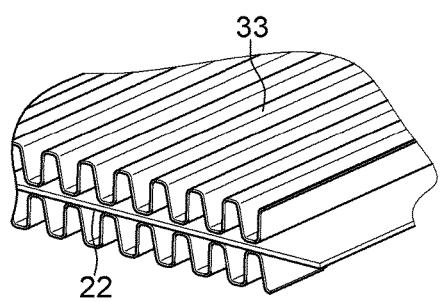
FIG. 6 is a partial perspective view illustrating a straight portion of a first inner fin according to the first embodiment.

FIG. 6 is a partial perspective view illustrating the straight portion 33 according to the present embodiment. The straight portion 33 has a waving shape in the width direction and provides a plurality of straight passages which extends in the flow direction.

Refer to FIG. 4 again, the corrugated portion 32 is arranged on a central side of the coolant passage of the tube 20a corresponding to the first heat sink 11b. It is preferable that the corrugated portion 32 is arranged corresponding to the first switching element 11a. The corrugated portion 32 overlaps with the entire shape of the first heat sink 11b. In other words, the corrugated portion 32 has the same size as the first heat sink 11b.

The straight portion 33 surrounds the corrugated portion 32. The straight portion 33 is configured to bypass the corrugated portion 32 along the flow direction. The straight passages of the straight portion 33 are arranged on a peripheral side of the coolant passage of the tube 20a, the upstream side from the corrugated portion 32, and a downstream side from the corrugated portion 32.

Some of the straight passages of the straight portion 33 provide coolant with bypassing the corrugated portion 32 at the peripheral side of the coolant passage. Each of the straight passages of the straight portion 33 has an upstream end and a downstream end. The upstream end of the straight portion 33 is arranged on the upstream side from the first heat sink 11b. The downstream end of the straight portion 33 is arranged on the downstream side of the coolant passage from the first heat sink 11b.

The remaining straight passages of the straight portion 33 are disposed on the upstream side from the corrugated portion 32 and the downstream side from the corrugated portion 32 to be connected to the corrugated portion 32.

The straight passages of the straight portion 33 which are connected to an upstream end of the corrugated portion 32 are formed along the flowing direction.

On the other hand, the straight passages of the straight portion 33 which are connected to a downstream end of the corrugated portion 32 are formed radially. More specifically, the straight passages of the straight portion 33 extend toward the second switching element 12a from the downstream end of the corrugated portion 32. Furthermore, the bypass passages of the straight portion 33, which are disposed on the peripheral side, form such a radial fin structure together with the straight passages, which extend from the corrugated portion 32. In other words, the bypassing passages on the peripheral side are directed toward the central side from the peripheral side of the coolant passage. Thus, the straight passages of the straight portion 33 as a whole have the radial fin structure on the downstream side to collect the coolant at the central side of the coolant passage.

The second fin plate 41 has a corrugated portion 42. The corrugated portion 42 of the second fin plate 41 has the same structure as the corrugated portion 32 of the first fin plate 41. The corrugated portion 42 of the second fin plate 41 is formed in the entire second fin plate 41.

The stream of the coolant which flows through the tube 20a according to the present embodiment will be described.

The coolant, which comes from the inlet pipe 50, flows through the first inner fin 30 at first. Then, the coolant, which goes through the first inner fin 30, flows through the second inner fin 40. Eventually, the coolant, which goes through the second inner fin 40, flows toward the outlet pipe 60.

More specifically, the coolant, which comes from the inlet pipe 50, is distributed to the straight passages of the straight portion 33. Some of the coolant goes to the corrugated portion 32 and cools the first switching element 11*a* via the first heat sink 11*b*. Eventually, the coolant is warmed by heat from the switching element 11*a*. The other of the coolant bypasses the corrugated portion 32 through the straight passage of the straight portion 33 on the peripheral side of the tube 20*a*. Then, the warmed coolant and the bypassing coolant are merged each other and flow toward the second switching element 12*b*. In other words, the warmed coolant and the bypassing coolant are collected on the central side of the coolant passage of the tube 20*a*.

The collected coolant is distributed to the corrugated passages of the second fin plate 41. The coolant exchanges heat with the second switching element 12*a* via the second heat sink 12*b*. The coolant, which comes out from the second fin plate 41, finally goes to the outlet pipe 60.

One effect of the power electronic module 100 according to the present embodiment will be described.

As described above, the coolant bypasses the corrugated portion 32 of the first inner fin 30 through the straight portion 33 of the first inner fin 30. The bypassing coolant has a lower temperature than the coolant, which flows through the corrugated portion 32 of the first inner fin 30. The second switching element 12*a* may be cooled by the bypassing coolant in addition to the warmed coolant so that a temperature of the second switching element 12*a* may be maintained at a similar temperature to the first switching element 11*a*.

Furthermore, the straight passages of the straight portion 33 forms the radial fin structure on the downstream side of the first fin plate 31. Thereby, the bypassing coolant easily flows toward the second switching element 12*a*.

Second Embodiment

In the first embodiment, the entire second fin plate 41 is corrugated. In the second embodiment, another second fin plate 241 is disposed instead of the second fin plate 41 according to the first embodiment.

Figure 7:
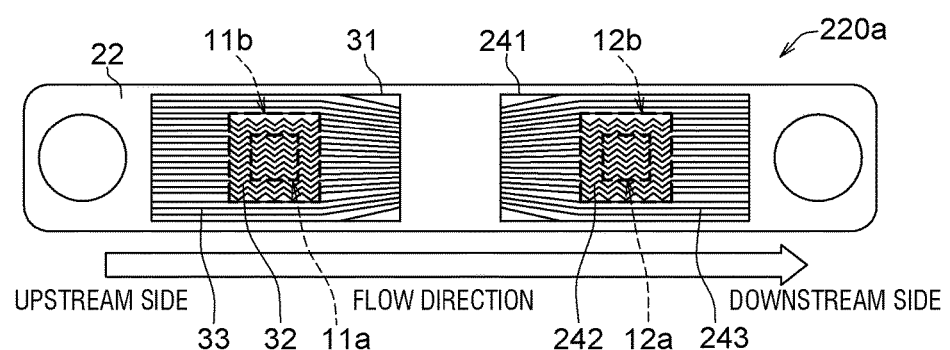
FIG. 7 is a plane view schematically illustrating a tube according to the second embodiment.

FIG. 7 depicts a plane view schematically illustrating a tube 220*a* according to the present embodiment. FIG. 7 shows the tube 220*a* that includes the second fin plate 241. The second fin plate 241 has the same structure as the first fin plate 31. The second fin plate 241 is used by turning upside down.

The second fin plate 241 has a corrugated portion 242 and a straight portion 243. The corrugated portion 242 and the straight portion 243 are the same structure as those of the first fin plate 31.

According to the present embodiment, the first fin plate 31 is the same structure as the second fin plate 241. Thereby, the first and second fin plate 31, 241 are uniform in the structure.

Third Embodiment

In the first embodiment, the first fin plate 31 has the radial fin structure at the downstream end thereof. In the third embodiment, another first fin plate 331 is disposed instead of the first fin plate 31 according to the first embodiment.

Figure 8:
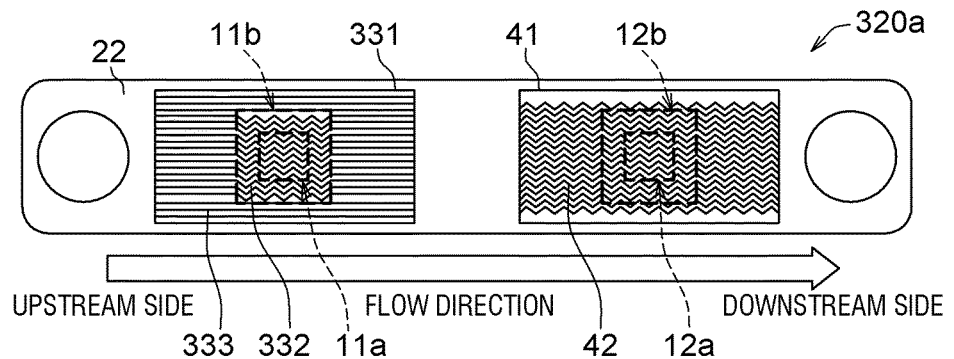
FIG. 8 is a plane view schematically illustrating a tube according to the third embodiment.

FIG. 8 depicts a plane view schematically illustrating a tube 320*a* according to the present embodiment. FIG. 8 shows the tube 320*a* that includes the first fin plate 331. In the present embodiment, a downstream end of the first fin plate 331 has the same structure as the upstream end of the first fin plate 331.

Concretely, the first fin plate 331 has a corrugated portion 332 and a straight portion 333. The corrugated portion 332 is the same as the corrugated portion 32 according to the first embodiment. The straight portion 333 has a plurality of straight passages along the flow direction. The straight portion 333 has a straight fin structure at the downstream end thereof. In other words, the straight passages of the straight portion are directed along the flow direction.

Fourth Embodiment

In the first embodiment, the first fin plate 31 has the corrugated portion only on the central side thereof. In the fourth embodiment, another first fin plate 431 is disposed instead of the first fin plate 31 according to the first embodiment.

Figure 9:
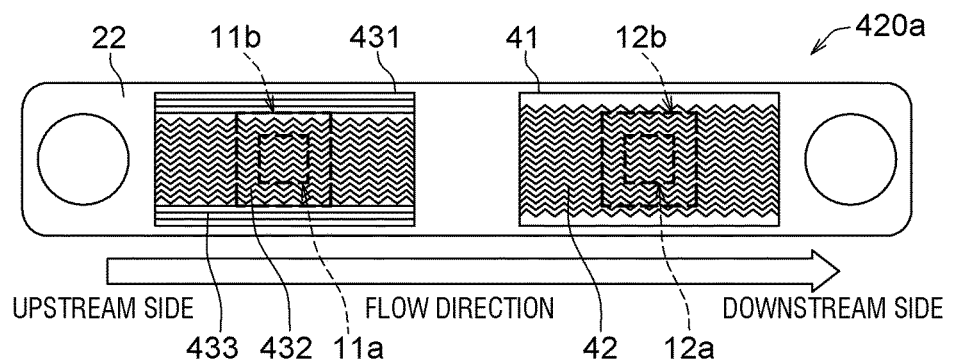
FIG. 9 is a plane view schematically illustrating a tube according to the fourth embodiment.

FIG. 9 depicts a plane view schematically illustrating a tube 420*a* according to the present embodiment. FIG. 9 shows the tube 420*a* that includes the first fin plate 431. The first fin plate 431 has a corrugated portion 432 and a straight portion 433. The corrugated portion 432 is arranged on the central side of the tube 420*a* and extends from the upstream end of the first fin plate 431 to the downstream end of the first fin plate 431.

The corrugated portion 432 has a plurality of corrugated passages extending along the flow direction. In other words, upstream ends and downstream ends of the corrugated portion 432 are corrugated. The straight portion 433 has a plurality of straight passages extending along the flow direction. The straight passages of the straight portion 433 provide the coolant with bypassing the corrugated portion 432 at the peripheral side of the coolant passage.

Fifth Embodiment

In the first embodiment, the first fin plate 31 of the first inner fin 30 and the second fin plate 41 of the second inner fin 40 leave the space between them. In the fifth embodiment, a third inner fin 90 is disposed between them instead of the space according to the first embodiment.

Figure 10:
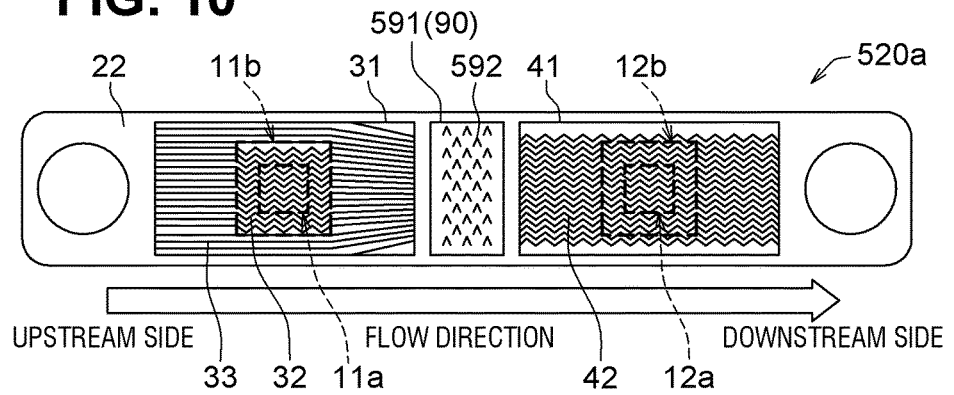
FIG. 10 is a plane view schematically illustrating a tube according to the fifth embodiment.

FIG. 10 depicts a plane view schematically illustrating a tube 520*a* according to the present embodiment. FIG. 10 shows the tube 520*a* that includes the third inner fin 90. The third inner fin 90 has two of third fin plates 591. One of the third fin plates 591 is disposed on a side of the upper plate 21 relative to the center plate 22. The other of the third fin plates 591 is disposed on a side of the lower plate 23 relative to the center plate 22.

The third fin plate 591 has a plurality of the protrusions 592 to disturb the stream of the collected coolant, which flows out from the straight portion 33 of the first fin plate 31. The plurality of the protrusions 592 are formed in the entire third fin plate 591. The third fin plate 591 is disposed apart from both of the first fin plate 31 and the second fin plate 41. The third fin plate 591 has a similar width to the coolant passage of the tube 520*a*.

According to the present embodiment, the tube 520*a* has the third inner fin 90. Thereby, the bypassing coolant easily flows toward the second switching element 12*a*. In other words, disturbance of the protrusion 592 provides the warmed coolant, which flowed through the corrugated portion 32, with being cooled by the bypassing coolant. Then, the coolant, which goes through the third fin plate 591, flows through the second fin plate 41 to cool the second switching element 12*a*.

Sixth Embodiment

In the first embodiment, the tube 20*a* has the first fin plate 31 and the second fin plate 41 separately. In the sixth embodiment, the first inner fin 30 and the second inner fin 40 are formed in a single integration fin plate 631.

Figure 11:
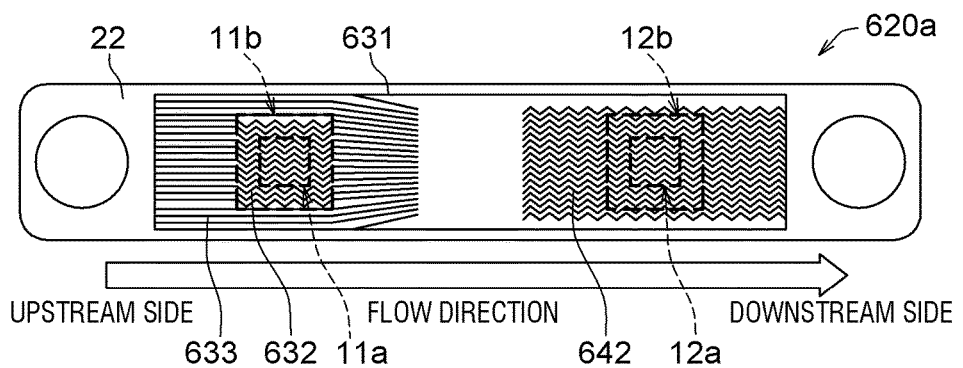
FIG. 11 is a plane view schematically illustrating a tube according to the sixth embodiment.

FIG. 11 depicts a plane view schematically illustrating a tube 620a according to the present embodiment. FIG. 11 shows the tube 620a that includes the integration fin plate 631. The integration fin plate 631 composes of the first inner fin 30 and the second inner fin 40 integrally.

More specifically, the integration fin plate 631 provides a corrugated portion 632 to cool the first switching element 11a, a straight portion 633 to bypass the corrugated portion 632, and another corrugated portion 642 to cool the second switching element 12a. The corrugated portion 632 has the same structure as the corrugated portion 32 of the first fin plate 31 according to the first embodiment. The straight portion 633 has the same structure as the straight portion 33 of the first fin plate 31 according to the first embodiment. The corrugated portion 642 has the same structure as the corrugated portion 42 of the second fin plate 41 according to the first embodiment.

Seventh Embodiment

In the fifth embodiment, the tube 520a has the first fin plate 31 of the first inner fin 30, the second fin plate 41 of the second inner fin 40, and the third fin plate 591 of the third inner fin 90 separately. In the seventh embodiment, the first inner fin 30, the second inner fin 40, and the third inner fin 90 are formed in a single integration fin plate 731.

Figure 12:
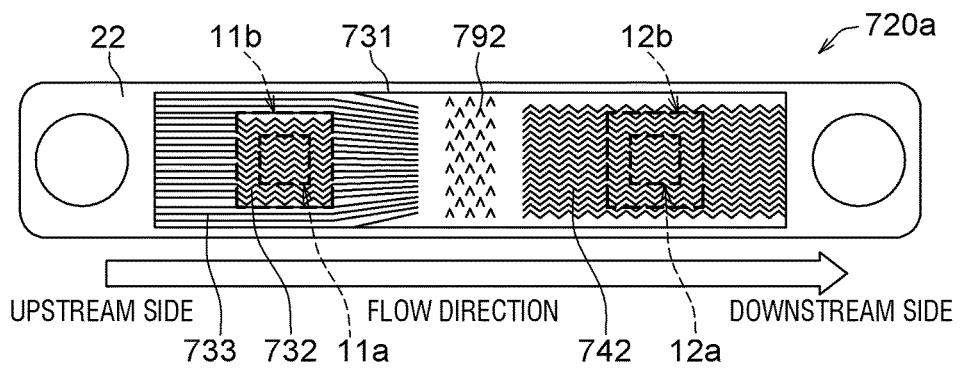
FIG. 12 is a plane view schematically illustrating a tube according to the seventh embodiment.

FIG. 12 depicts a plane view schematically illustrating a tube 720a according to the present embodiment. FIG. 12 shows the tube 720a that includes the integration fin plate 731. The integration fin plate 731 composes of the first inner fin 30, the second inner fin 40, and the third inner fin 90 integrally.

More specifically, the integration fin plate 731 provides a corrugated portion 732 to cool the first switching element 11a, a straight portion 733 to bypass the corrugated portion 732, another corrugated portion 742 to cool the second switching element 12a, and a plurality of protrusions 792.

The corrugated portion 732 has the same structure as the corrugated portion 32 of the first fin plate 31 according to the fifth embodiment. The straight portion 733 has the same structure as the straight portion 33 of the first fin plate 31 according to the fifth embodiment. The corrugated portion 742 has the same structure as the corrugated portion 42 of the second fin plate 41 according to the fifth embodiment. The plurality of the protrusions 792 have the same structure as the plurality of the protrusions 592 of the third fin plate 591 according to the fifth embodiment.

Other Embodiments

In the first embodiment, the power electronic module 100 is equipped in the vehicle. However, the power electronic module is not limited to be equipped in the vehicle and may be alternatively equipped in a train, a ship, and so forth.

In the first embodiment, the plurality of the power devices 10 are composed of eight pairs of the first power device 11 and the second power device 12. Furthermore, the number of the tubes 20a is nine. However, the number of the pairs of the first and second power devices is not limited to be eight. Furthermore, the number of the tubes is not limited to be nine.

In the first embodiment, the first and second power devices 11, 12 are used in parallel electrically. However, the first and second power devices are not limited to be used in parallel and may be used in series.

In the first embodiment, the power electronic module 100 has the first power devices 11 and the second power devices 12. However, the power electronic module is not limited to have two kinds of the power devices and may have a third power device and fourth power device in addition to the first and second power devices. In that case, the first power device, the second power device, the third power device, and the fourth power device are disposed along the flow direction. Furthermore, a third inner fin and a fourth inner fin are disposed corresponding to the power devices in addition to the first inner fin and the second inner fin.

In the first embodiment, each of the pairs of the first power device 11 and the second power device 12 is disposed respectively between the tubes 20a. However, the number of the pairs of the power devices, which are disposed respectively between the tubes, is not limited to be one and may be two and three, and so forth.

In the first embodiment, each of the power devices 10 includes the two heat sinks 11b, 12b. However, the number of the heat sinks, which are included in each of the power devices, is not limited to be two and may be one. In that case, a radiation surface of the heat sink may be disposed on only one side of the power device.

In the first embodiment, the first fin plates 31 are made of aluminum and the second fin plates 41 are made of copper. However, the materials of the fin plates are not limited to be different and may be the same. In that case, the first fin plates and the second fin plates may be made of aluminum or copper.

In the first embodiment, the corrugated portion 32 has the same size as the first heat sink 11b. However, the size of the corrugated portion is not limited to be the same as the first heat sink and may be bigger or smaller than the first heat sink.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed. As used herein, the term "and/or" includes any and all combinations of one or more of the associated listed items.

What is claimed is:

1. A power electronic module comprising:
a first power device having a first switching element;
a second power device having a second switching element; and
a cooler having a coolant passage to cool the first and second power devices, the cooler including a first inner fin and a second inner fin in the coolant passage, wherein
the first power device and the second power device are disposed along a flow direction of the coolant passage so that the first power device is arranged on an upstream side of the coolant passage from the second power device,
the first and second inner fins are disposed along the flow direction corresponding to the first and second power devices so that the first inner fin is arranged on the upstream side from the second inner fin,
the first inner fin has a corrugated passage and a straight passage, and
the straight passage bypasses the corrugated passage along the flow direction, wherein
the corrugated passage is arranged on a central side of the coolant passage corresponding to the first switching element,
the straight passage is arranged on a peripheral side of the coolant passage, and
the straight passage has a downstream end, which is directed toward the central side from the peripheral side of the coolant passage.

2. The power electronic module according to claim 1, wherein
the straight passage has an upstream end and a downstream end,
the upstream end is arranged on the upstream side from the first switching element, and
the downstream end is arranged on a downstream side of the coolant passage from the first switching element.

3. The power electronic module according to claim 1, wherein
the first inner fin is composed of a first fin plate,
the second inner fin is composed of a second fin plate,
the second fin plate has the same structure as the first fin plate, and
the second fin plate is used by turning upside down.

4. The power electronic module according to claim 1, wherein
the cooler has an upper plate, a center plate, and a lower plate,
the upper plate is laminated on one side of the center plate to provide a half of the coolant passage,
the lower plate is laminated on the other side of the center plate to provide the other half of the coolant passage,
the first inner fin is composed of two first fin plates,
the second inner fin is composed of two second fin plates,
one of the first fin plates and one of the second fin plates are disposed between the upper plate and the center plate, and
the other of the first fin plates and the other of the second fin plates are disposed between the lower plate and the center plate.

5. The power electronic module according to claim 1, wherein
the first inner fin and the second inner fin are integrally composed of a single plate.

6. The power electronic module according to claim 1, wherein
the cooler further includes a third inner fin in the coolant passage,
the third inner fin is arranged between the first inner fin and the second inner fin, and
the third inner fin has a plurality of protrusions to disturb stream of coolant.

7. The power electronic module according to claim 6, wherein
the first inner fin, the second inner fin, and the third inner fin are integrally composed of a single plate.

8. The power electronic module according to claim 1, wherein
the cooler includes a plurality of a tubes having the coolant passages,
the first power device and the second power device are stacked between the plurality of the tubes.

9. A cooler for cooing a plurality of power devices comprising:
a tube having a coolant passage therein;
a first inner fin disposed in the coolant passage; and
a second inner fin disposed in the coolant passage, wherein
the first and second inner fins are disposed along a flow direction of the coolant passage so that the first inner fin is arranged on an upstream side of the coolant passage from the second inner fin,
the first inner fin has a corrugated passage and a straight passage, and
the straight passage bypasses the corrugated passage along the flow direction, wherein
the corrugated passage is arranged on a central side of the coolant passage,
the straight passage is arranged on a peripheral side of the coolant passage, and
the straight passage has a downstream end, which is directed toward the central side from the peripheral side of the coolant passage.

10. The cooler according to claim 9, wherein
the first inner fin is composed of a first fin plate,
the second inner fin is composed of a second fin plate,
the second fin plate has the same structure as the first fin plate, and
the second fin plate is used by turning upside down.

11. The cooler according to claim 9, wherein
the tube includes an upper plate, a center plate, and a lower plate,
the upper plate is laminated on one side of the center plate to provide a half of the coolant passage,
the lower plate is laminated on the other side of the center plate to provide the other half of the coolant passage,
the first inner fin is composed of two first fin plates,
the second inner fin is composed of two second fin plates,
one of the first fin plates and one of the second fin plates are disposed between the upper plate and the center plate, and
the other of the first fin plates and the other of the second fin plates are disposed between the lower plate and the center plate.

12. The cooler according to claim 9, wherein
the first inner fin and the second inner fin are integrally composed of a single plate.

13. The cooler according to claim 9, further composing a third inner fin disposed in the coolant passage, wherein
the third inner fin is arranged between the first inner fin and the second inner fin, and
the third inner fin has a plurality of protrusions to disturb stream of coolant.

14. The cooler according to claim 9, wherein
the first inner fin, the second inner fin, and the third inner fin are integrally composed of a single plate.

* * * * *